US006949424B2

(12) United States Patent
Springer

(10) Patent No.: US 6,949,424 B2
(45) Date of Patent: Sep. 27, 2005

(54) SINGLE POLY-EMITTER PNP USING DWELL DIFFUSION IN A BICMOS TECHNOLOGY

(75) Inventor: Lily Springer, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 34 days.

(21) Appl. No.: 10/650,621

(22) Filed: Aug. 28, 2003

(65) Prior Publication Data

US 2005/0045948 A1 Mar. 3, 2005

(51) Int. Cl.7 ............................................ H01L 21/8238

(52) U.S. Cl. ....................... 438/202; 438/369; 438/527; 257/370

(58) Field of Search ................................ 438/202, 350, 438/369, 527, 234; 257/370, 565

(56) References Cited

U.S. PATENT DOCUMENTS 5,643,809 A 7/1997 Lien
5,904,536 A 5/1999 Blair
6,440,812 B2 * 8/2002 Violette ...................... 438/369
6,475,850 B2 * 11/2002 Violette et al. ............. 438/203
6,589,849 B1 7/2003 Lee
6,803,634 B2 * 10/2004 Okuno et al. ............... 257/378
2002/0155673 A1 10/2002 Camalleri et al.

* cited by examiner

*Primary Examiner*—Amir Zarabian
*Assistant Examiner*—Christy Novacek
(74) *Attorney, Agent, or Firm*—Jacqueline J. Garner; W. James Brady, III; Frederick J. Telecky, Jr.

(57) ABSTRACT

A method of forming a bipolar transistor device, and more particularly a vertical poly-emitter PNP transistor, as part of a BiCMOS type manufacturing process is disclosed. The formation of the PNP transistor during a CMOS/DMOS fabrication process requires merely one additional mask to facilitate formation of a very small emitter in a portion of an N-type surface layer of a double diffused well (DWELL). Unlike conventional PNP transistors, a separate mask is not required to establish the base of the transistor as the transistor base is formed from a portion of the double diffused well and the DWELL includes a P-type body layer formed via implantation through the same opening in the same mask utilized to establish the N-type surface layer of the double diffused well. The base is also thin thus improving the transistor's frequency and gain.

30 Claims, 14 Drawing Sheets

SINGLE POLY-EMITTER PNP USING DWELL DIFFUSION IN A BICMOS TECHNOLOGY

FIELD OF INVENTION

The present invention relates generally to semiconductor devices and more particularly relates to a method of efficiently forming a poly-emitter bipolar transistor as part of a CMOS/DMOS fabrication process.

BACKGROUND OF THE INVENTION

Integrated circuits having bipolar and MOS transistors formed on the same semiconductor substrate have many uses in the electronics industry and are therefore in great demand. One significant advantage of such devices is that they combine the high power and fast switching speeds of bipolar devices with the high density and low power consumption of MOS transistors. The diversity of uses for such BiCMOS devices has fueled a surge toward fabricating faster, denser and more powerful integrated BiCMOS devices by more individual device enhancing manufacturing processes.

When forming devices using a BiCMOS manufacturing process, care is taken to minimize the number of masks employed therein to lower the manufacturing costs. Therefore efforts are made as often as is practicable to integrate the use of regions typically utilized for CMOS/DMOS devices as regions in a bipolar device, and vice-versa. While such integration does serve to minimize manufacturing costs, in some cases the integration causes performance tradeoffs to be made.

For example, prior art FIG. 1 illustrates an NPN type bipolar transistor 10 fabricated using a BiCMOS type fabrication process. The transistor 10 has an n-buried layer (NBL) 12 that is formed in a lightly doped P-type substrate 14. A P-type epitaxial (epi) layer 16 is then grown over the NBL 12 and the substrate 14. A deep N+ ring 18 is then formed by performing either an N-type implant or N-type thermal deposition in the epi 16. The deep N+ ring 18 couples down to the NBL 12 to form a collector region 20. The deep N+ ring 18 also defines therein an isolated base region 22 comprising the P-epi. The N+ region 18 is usually made a ring to provide isolation and serves as a plug extending down to the NBL region 12 for purposes of making contact thereto. A P-type source/drain implant is then performed to define a base contact region 24 and an N-type source/drain implant is performed to form an emitter region 26, wherein the base contact region is formed concurrently with the formation of PMOS source/drain regions elsewhere, and the emitter region is formed concurrently with NMOS source/drain regions elsewhere, respectively.

The NPN bipolar transistor 10 of prior art FIG. 1 may be employed in various types of applications, and in some applications the transistor breakdown voltage may be an issue. For example, a collector-to-emitter breakdown voltage ($BV_{CEO}$) of the transistor 10 relies on the base (or epi ) thickness. That is, a distance 28 between a bottom of the emitter 26 and a top of the NBL 12 will have a significant impact on $BV_{CEO}$. Although the epi region 16 is initially thick, the thickness of the epi is reduced at locations where the NBL is present due to an up-diffusion 30 of the NBL. The thin epi 16 in that region limits transistor $BV_{CEO}$ by letting the space charge region at the NBL and epi junction reach the emitter during device operation, disadvantageously resulting in a punch-through breakdown condition.

If the epi layer thickness could be increased, or the NBL thickness could be reduced, the transistor $BV_{CEO}$ can be increased. The epi and NBL thicknesses, however, are fixed uniformly across the die for the standard BiCMOS process, and thus any local adjustments thereof would require additional masks and/or processing steps. Such additional actions are disadvantageous when attempting to minimize costs in the fabrication process.

Another NPN type bipolar transistor device fabricated in a standard BiCMOS manufacturing process is illustrated in prior art FIG. 2, and designated at reference numeral 50. The transistor 50 has the NBL 12 fabricated in the substrate (p-sub) 14 and the epi layer 16 is formed thereover in a manner similar to that described above. Deep N+ regions 18 are formed down to the NBL 12 and a deep n-well region 52 is formed in the P-epi 16 down to the NBL as illustrated. Concurrently, deep n-well regions are formed elsewhere on the die and are utilized for various purposes, for example, as high voltage PMOS transistors' tank region.

Once the deep n-well region 52 is formed, a shallow P-well region 54 is formed in the deep n-well to form the base region 56. Therefore the NBL 12, deep N+ region 18 and the deep n-well 52 together form the collector 58 of the bipolar transistor 50. N-type and P-type source/drain implants are then performed to form the emitter region 60 and the base contact region 62, respectively.

The bipolar transistor 50 has a poor gain, which is sometimes referred to as the transistor $\beta$ or $H_{FE}$. When using the BiCMOS process described above, the N-type source/drain region 60 which forms the emitter is quite shallow (for CMOS/DMOS optimization), and the shallow p-well 54 has a high doping concentration, is rather deep, and has a slight retrograde profile for CMOS/DMOS purposes, and these factors contribute to poor bipolar transistor gain. That is, a depth 64 of the heavily doped shallow p-well 54 and the shallowness of the emitter (NSD) 60 results in a depth difference (or base width) 66 that is relatively large, thereby resulting in a low gain. This is disadvantageous in transistor applications where a high gain is important or desired.

Additionally, vertical PNP transistor devices isolated from a substrate do not exist typically in BiCMOS (LBC) technologies. As mentioned above, such technologies are CMOS/DMOS optimized and the bipolar transistors are built using CMOS/DMOS masks to keep costs low. As such, devices produced thereby experience some of the aforementioned deficiencies. Some vertical PNPs do exist, however, but these PNPs are substrate PNP devices which inject current into the substrate and cause undesirable substrate debiasing and latchup.

Lateral PNPs similarly have undesirable characteristics in that they are large and slow. For example, lateral PNPs can measure between about 20 to 30 micrometers and can operate at an Ft of less than 100 mega-hertz. Lateral PNPs also require deep N isolation to mitigate leakage and collector resistance. Moreover, conventional poly-emitter PNPs require two to four additional masks to be formed, thus adding expense to the manufacturing process. In particular, one conventional technique for forming a self-aligned poly-silicon-emitter PNP transistor requires three additional masks in a CMOS/DMOS optimized BiCMOS process. In such a process respective masks are required for establishing a buried P+ layer (BPL) which serves as a collector region of the transistor, an intrinsic N-base layer and an emitter opening area. Similarly, a poly-silicon-emitter PNP can be formed in a SiGe-base heterojunction bipolar transistor (HBT) process, but such a process is complex and expensive aiming at high performance. Such a process is not, however, cost effective.

Therefore, there is a need in the art for a CMOS/DMOS manufacturing process that allows for optimization of bipolar transistor parameters, and in particular to parameters related to vertical PNP transistors, but does not significantly increase the number of steps and/or masks required in the process.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to a method of forming a bipolar transistor device, and more particularly a vertical poly-emitter PNP transistor, as part of a BiCMOS type manufacturing process. The formation of the PNP transistor during a CMOS/DMOS fabrication process relies on merely one additional mask that facilitates formation of a small emitter in a portion of an N-type surface layer of a double diffused DWELL. The DWELL includes a P-type body layer formed via implantation through the same opening in the same mask utilized to establish the N-type surface layer.

According to one or more aspects of the present invention, a method of forming a vertical PNP bipolar transistor in a BiCMOS process is disclosed. The transistor is formed upon a wafer having a silicon substrate, and the method includes forming a double diffused DWELL in a DNWELL formed within a P-epi layer formed across the substrate. The method also includes forming a SPWELL in the DNWELL region adjacent the DWELL region. Then, a layer of oxide material is formed across the wafer, and the layer of oxide material is patterned so as to serve as a gate oxide in a CMOS/DMOS device. A layer of poly-silicon is then formed across the wafer and is patterned so as to serve as part of a gate stack in a CMOS/DMOS device. The patterned poly-silicon serves as an emitter contact for the vertical PNP transistor. Finally, PSD/NSD implants are performed to establish a collector contact and a base contact, respectively, for the vertical PNP bipolar transistor.

In accordance with one or more other aspects of the present invention, a vertical PNP bipolar transistor is disclosed. The transistor is formed as part of a BiCMOS process, and is formed upon a wafer having a silicon substrate. The transistor includes a double diffused DWELL in a DNWELL formed within a P-epi layer formed across a substrate. The transistor also includes a SPWELL in the DNWELL region formed adjacent the DWELL region. A layer of oxide material is also included in the transistor. The layer of oxide material is formed across the wafer and is patterned so as to serve as a gate oxide in a CMOS/DMOS device. Similarly, a layer of poly-silicon is included and is formed across the wafer and patterned so as to serve as part of a gate stack in a CMOS/DMOS device. The patterned poly-silicon serves as an emitter contact for the vertical PNP transistor, and includes a P-type dopant that can diffuse into a small portion of the DWELL to establish an emitter in the transistor. The transistor also includes PSD/NSD implants that establish a collector contact and a base contact, respectively, for the vertical PNP transistor.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
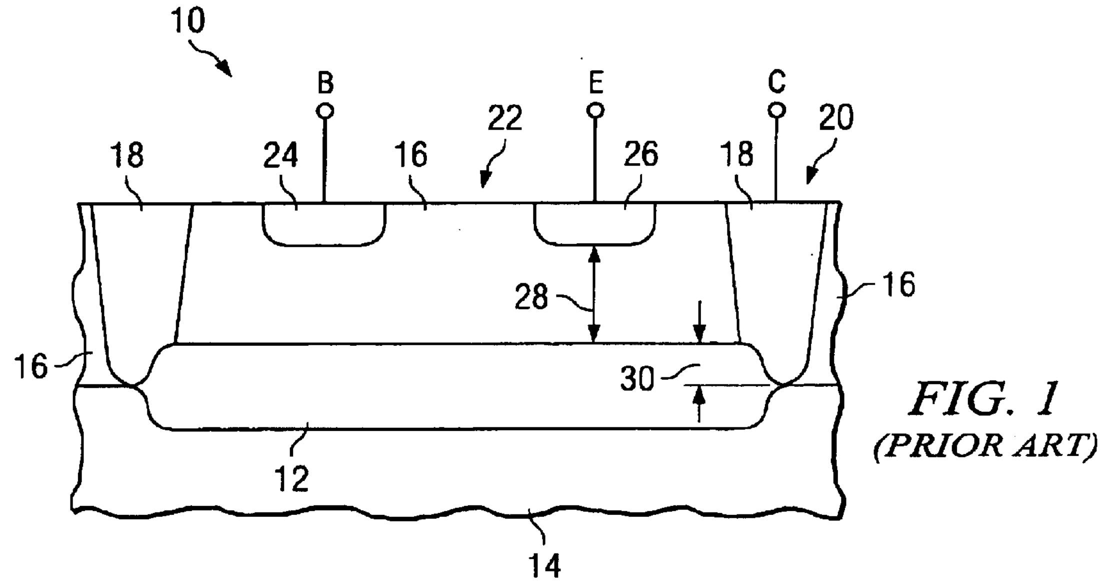
FIG. 1 is a prior art fragmentary cross section diagram illustrating a bipolar transistor device formed in a BiCMOS type integrated circuit manufacturing process.
Figure 2:
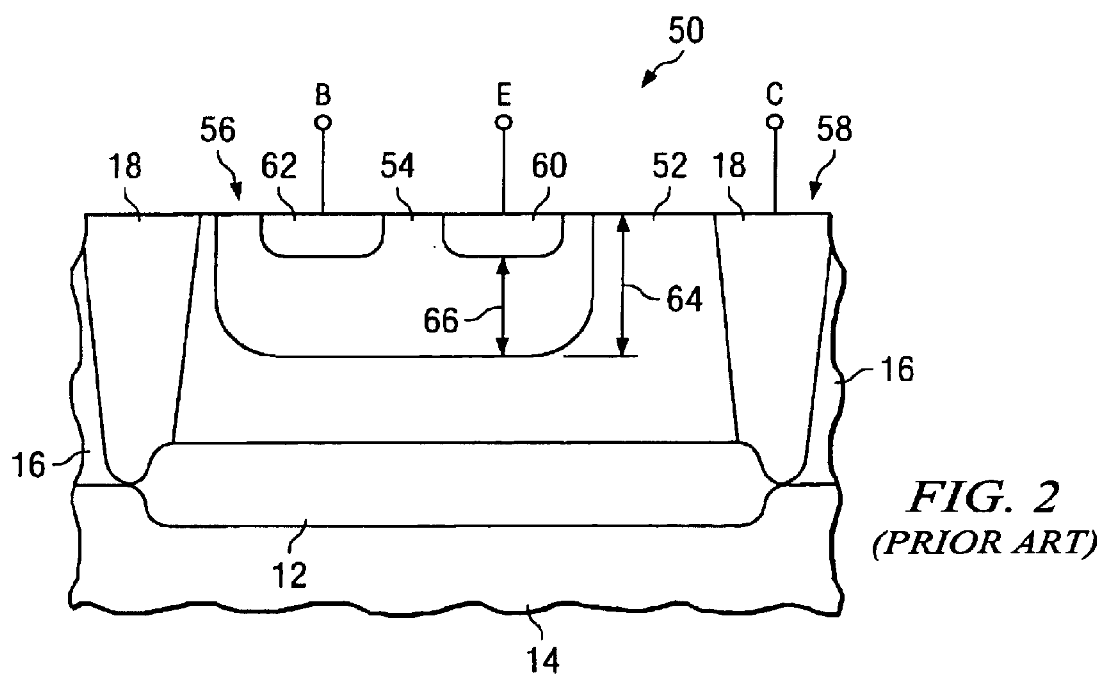
FIG. 2 is a prior art fragmentary cross section diagram illustrating another bipolar transistor device formed in a BiCMOS type integrated circuit manufacturing process.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

One or more aspects of the present invention pertain to a method of forming a bipolar transistor device, and more particularly a vertical poly-emitter PNP transistor, as part of a BiCMOS type manufacturing process. The formation of the PNP transistor during a CMOS/DMOS fabrication process requires merely one additional mask to facilitate formation of a small emitter in a portion of an N-type surface layer of a double diffused well (DWELL). Unlike conventional PNP transistors, a separate mask is not required to establish the base of the transistor as the transistor base is formed from a portion of the double diffused well and the DWELL includes a P-type body layer formed via implantation through the same opening in the same mask utilized to establish the N-type surface layer of the double diffused well. The base is also thin thus improving the transistor's frequency and gain.

Figure 3:
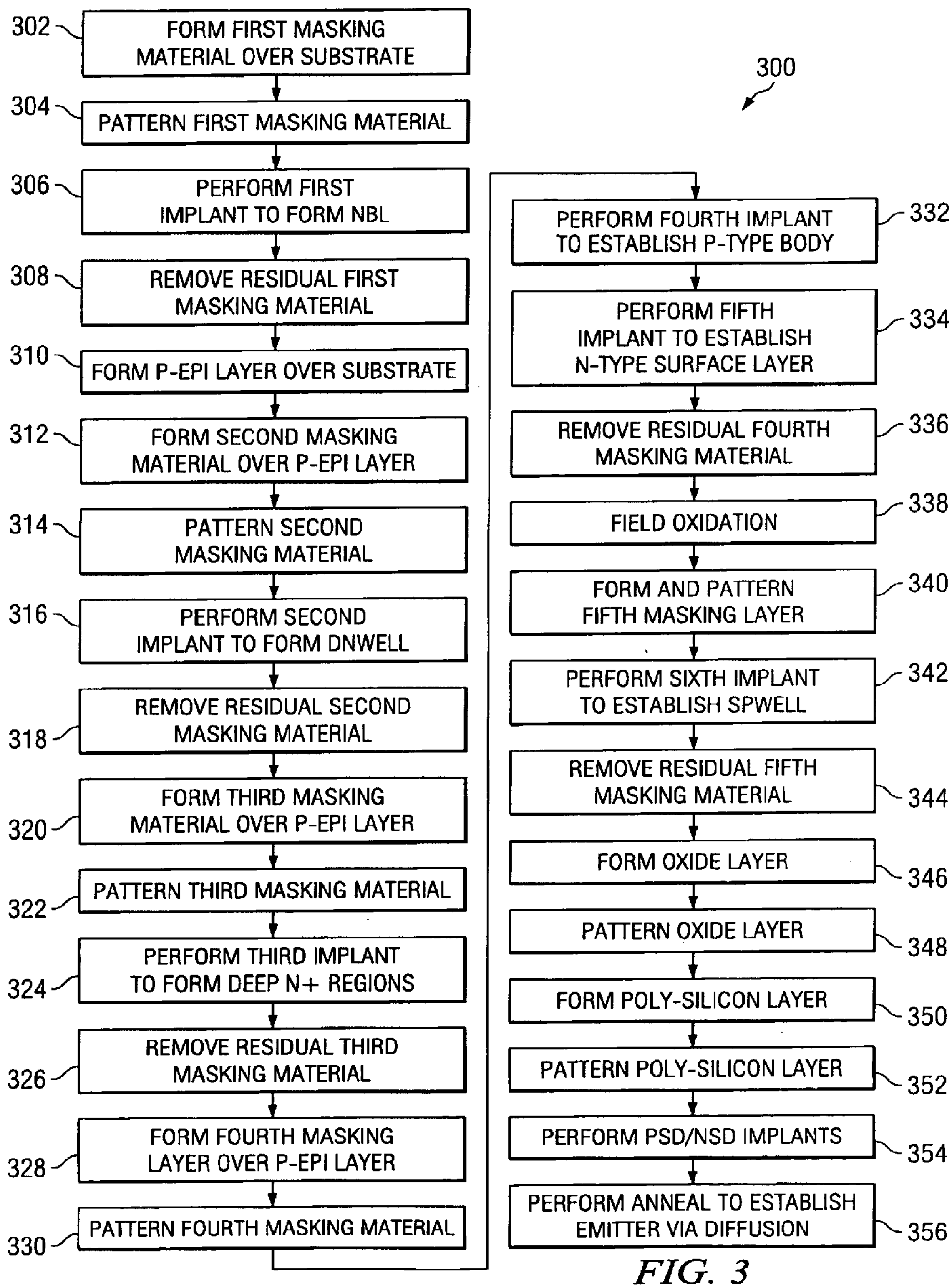
FIG. 3 is a flow diagram depicting a method of forming a vertical poly-emitter PNP transistor in accordance with one or more aspects of the present invention.

Turning now to FIG. 3, a method 300 of forming a bipolar vertical poly-emitter PNP transistor as part of a BiCMOS type manufacturing process is disclosed. Although the methodology 300 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a transistor as illustrated and described below with respect to FIGS. 4–30, as well as to devices not shown or described with regard to the accompanying figures, and such figures are not intended to limit the scope of the present invention.

The methodology 300 begins at 302 wherein a first layer of masking material is formed over a lightly doped P-type semiconductor body or substrate. It will be appreciated that although the term substrate is intended to include a semiconductor substrate, a semiconductor epitaxial layer deposited or otherwise formed on a substrate and/or any other type semiconductor body, and all such structures are contemplated as falling within the scope of the present invention. Additionally, the masking layer can include any suitable material that can serve as an implantation mask. The first masking layer can, for example, include a photo-resist material and/or a dielectric material (e.g., oxide) formed via a spin-on and/or other type deposition process.

The first masking layer is then patterned at 304 to form an opening therein. A photo-resist can, for example, be formed to a thickness of about 0.96 microns and then selectively exposed to particular type(s) of radiation to form a pattern therein. A solvent can then be utilized to selectively remove the exposed or unexposed portions of the photo-resist depending upon whether the resist is a positive or negative photo-resist to reveal the pattern. Similarly, a dry etch can be utilized to pattern an oxide based first masking layer.

At 306, a first dopant is then applied to the structure. The dopant is blocked by the layer of masking material, but passes through the opening formed therein. In this manner, a doped region is formed within the substrate at a location coincident with the opening formed within the layer of masking material. The dopant is implanted in the substrate at a concentration (in atoms/$cm^3$) and at an associated energy (in KeV). The degree of doping is thus dependent upon these parameters, as well as the duration of the implantation. The dopant may, for example, be one or more N-type dopants such as Arsenic (As) and/or Antimony (Sb) to establish an N buried layer (NBL) within the transistor substrate. A dopant of Antimony can, for example, be implanted at a concentration of about 4.5 $e^{15}/cm^3$ at an energy level of about 60 KeV to establish an NBL within the transistor substrate.

The remaining portions of the first masking material are then removed or stripped away from the substrate at 308. A semiconductor layer is then formed over the substrate at 310. For example, a P-type layer formed via epitaxial growth (P-epi ) can be established over the substrate. Such a P-epi layer can, for example, be formed to a thickness of between about 5 to 25 microns at about 1150 degrees Celsius. It will be appreciated that the P-epi layer may include a P-type dopant, such as Boron, for example. It will also be appreciated that due to the thermal conditions present during formation of the P-epi layer (as well as other subsequent processing), the NBL region may diffuse up into the P-epi layer (e.g., to about 1750 Angstroms). By way of example, NBL diffusion may occur as a result of thermal cycling.

A second layer of masking material is then formed over the P-epi layer at 312. As with the first masking layer, the second layer of masking material can include any suitable material and/or combination of materials that can be patterned to facilitate a subsequent selective doping. For example, the second masking layer can include a photoresist material and/or a dielectric material formed via a spin-on and/or other type deposition process.

At 314, the second masking layer is patterned to form an opening therein. The second layer of masking material can, for example, be patterned with particular type(s) of radiation as discussed above. In one example, the opening is arranged so as to overlie the NBL region formed within the substrate. A second dopant implant is then performed at 316 to establish a deep N-well (DNWELL) within the P-epi layer above the NBL region. The second implant is a lightly doped, high energy implant utilizing one or more N-type dopants such as Arsenic (As) and/or Phosphorous (P). Arsenic can, for example, be implanted at a concentration of 4 $e^{11}/cm^3$ at an energy level of 135 KeV. Phosphorous can similarly be implanted at a concentration of 3.6 $e^{12}/cm^3$ and at an energy level of 900 KeV, for example. Additionally, the DNWELL can also be subjected to heat treatment to achieve the desired junction depth and doping concentration. At 318, the remaining second masking layer is then removed.

An optional third layer of masking material is then formed over the P-epi layer at 320. The optional third masking layer can, for example, be formed to a thickness of about 7500 Angstroms at about 1000 degrees Celsius for about 184 minutes in the presence of a steam oxidation. At 322, the third masking layer is patterned as described above to form openings over the P-epi layer adjacent the DNWELL. A dry etch can, for example, be utilized to pattern the third masking layer to about 0.96 micrometers.

An optional third implant is then performed at 324 to form optional deep N+ regions within the P-epi layer adjacent the DNWELL. The third implant is a highly doped, high energy implant utilizing an N-type dopant such as Arsenic and/or Phosphorous, for example. Upon implant and activation (e.g., via heat treatment), the deep N+ regions extend down to the NBL region. It is to be appreciated that the ordering of the acts described herein can be altered and that such re-ordering is contemplated by one or more aspects of the present invention. For example, the deep N+ regions can be formed prior to forming the DNWELL area within the P-epi region. It is to be further appreciated that the third implant and the deep N+ regions formed thereby are not required and are not included in a preferred example. Such deep N+ regions may nevertheless serve to mitigate lateral parasitic PNP action, however. The remaining third masking layer is then removed or stripped away at 326.

A double diffused well (DWELL) comprised of an N-type surface layer and a P-type body layer is then formed within the DNWELL region above at least part of the NBL region. Meanwhile this DWELL layer is used elsewhere to form DMOS transistors in this process.

Accordingly, a fourth layer of masking material is formed over the P-epi layer at 328. This DWELL masking layer is then patterned at 330 as discussed above to form an opening therein above the DNWELL and NBL regions.

A fourth implantation is then performed at 332 to establish a P-type body layer within the DNWELL region. The fourth implant can be a single or multiple implant process and utilize a P-type dopant such as Boron, for example. In one example, Boron can be implanted at a concentration of 2 $e^{13}/cm^3$ at an energy level of 50 KeV, and then at a concentration of 1.5 $e^{14}/cm^3$ at an energy level of 400 KeV to achieve a desirable DWELL doping profile.

Then a fifth implant is performed at 334 using the same mask as used for the P-type body implant (i.e., the fourth masking layer) to establish an N-type surface layer within the P-type body layer. The fifth implant can be a low energy implant utilizing an N-type dopant such as Arsenic, for example. In one example, a dopant of Arsenic is implanted at a concentration of 7.5 $e^{13}/cm^3$ at an energy level of 160 KeV. The fifth implant can then be annealed to remove implant damage. The fourth masking layer is then stripped away at 336.

It will be appreciated that even though the P-type body and the N-type surface layer are implanted through the same opening in the fourth masking layer, the P-type body may have a slightly greater width than the N-type surface layer. This may be due to diffusion of the P-type dopant in the body layer (e.g., from heat treatment such as annealing).

At 338, field oxidation occurs. In particular, surface portions of the transistor are etched and allowed to oxidize. By way of example, oxidation occurs at about 950 degrees Celsius in the presence of steam in the span of about 230 minutes. The select oxidized areas can be, for example, between about 5800 to 6600 Angstroms in thickness, and such field oxide (FOX) regions define active areas therebetween. Alternatively, the field oxidation at 338 may be replaced with a shallow trench isolation process (STI), as may be desired.

A shallow p-well (SPWELL) region is then formed in the DNWELL region adjacent to, and potentially slightly overlapping, the DWELL region. Accordingly, at 340, a fifth masking layer is formed and patterned as described above. Such a masking layer may be formed to about 2.5 microns, for example. A sixth implant is then performed at 342 to form the SPWELL. A P-type dopant, such as Boron can, for example, be implanted at a concentration of about 1.6 $e^{13}/cm^3$ at an energy level of about 500 KeV. It will be appreciated that the SPWELL thermal implantation can be followed by thermal processing. The fifth masking layer is then removed at 344.

A layer of oxide material is then formed over the entire structure at 346. The oxide layer can, for example, be formed to a thickness of about 300 Angstroms at about 900 degrees Celsius in the presence of $O_2$. The layer of oxide material serves as a gate oxide in a CMOS/DMOS device and is patterned accordingly at 348. The patterning of the oxide layer, exposes a portion of the N-type surface layer of the DWELL, the silicon elsewhere is covered by the gate oxide.

A layer of poly-silicon is then deposited over the entire structure at 350. The poly-silicon layer can, for example, be formed to a thickness of about 2400 to 5000 Angstroms. This poly-silicon fills in the exposed silicon area over the N-type surface layer of the DWELL during patterning of the oxide layer. The layer of poly-silicon is then patterned at 352 so as to serve as part of a gate stack of a CMOS/DMOS device. The poly-silicon may include a dopant, such as a P-type dopant (e.g., Boron), and may be introduced in-situ or via a subsequent selective implantation (e.g., using PSD).

The methodology 300 continues at 354 wherein implants (such as those employed in the BiCMOS process to form P-type and N-type source/drain regions) are performed to form a collector region contact and a base region contact, respectively. Accordingly, a PMOS source/drain mask may be utilized to define an opening through which a P-type source/drain implant is performed to form a PSD (P-type source/drain) region that serves as a contact for the collector region of the poly-emitter vertical bipolar transistor. Such implant is also employed to dope the poly-silicon area residing over the exposed silicon region and contacting the N-type surface layer of the DWELL. Similarly, an NMOS source/drain mask may be employed to define one or more openings through which an N-type source/drain implant is performed to form an NSD (N-type source/drain) region(s) that serves as a contact for the base of the bipolar transistor. That is, the same implant employed to form the PMOS and NMOS transistor source/drain regions elsewhere on the die is employed to form the collector contact and base contact for the bipolar transistor.

At 356, an anneal or other heat treatment is performed to establish an emitter within the vertical bipolar transistor. In particular the emitter is created by allowing P-type dopant (e.g., Boron) in the P-type poly to diffuse into the N-type surface layer of the DWELL The methodology may then continue with conventional back-end metallization and interconnect processing.

Turning now to FIGS. 4–30, an exemplary technique for forming one or more transistors in accordance with one or more aspects of the present invention is disclosed. More particularly, cross-sectional illustrations of one or more transistors 400 formed upon a substrate 402 illustrate a fabrication process wherein a vertical bipolar transistor is formed as part of a BiCMOS process. It is to be appreciated that the substrate can be formed out of any suitable material, but generally includes a silicon based material. It will be further appreciated that the term substrate as used herein can include a base semiconductor wafer (e.g., silicon, SiGe, or an SOI wafer) and any epitaxial layers or other type semiconductor layers formed thereover or associated therewith. It is to be still further appreciated that elements and/or layers depicted herein are illustrated with particular dimensions relative to one another (e.g., layer to layer dimensions and/or orientations) for purposes of simplicity and ease of understanding, and that the actual dimensions of such elements/layers may differ substantially from that illustrated herein.

Figure 4:
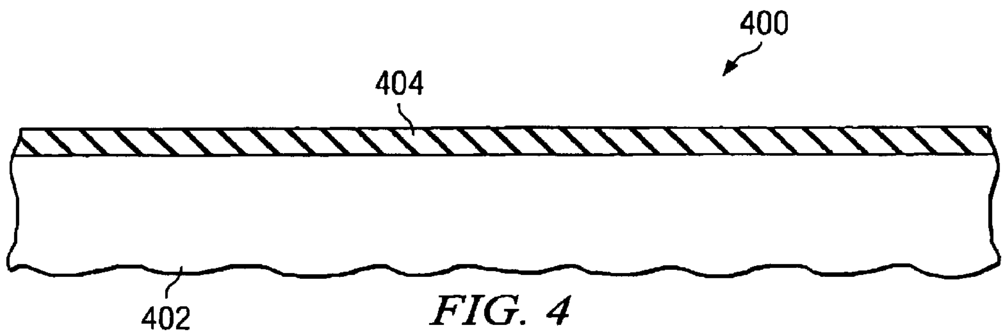
FIGS. 4–30 are fragmentary cross section diagrams illustrating the formation of a vertical poly-emitter PNP transistor in accordance with one or more aspects of the present invention.

Initially, a first layer of masking material 404 is formed over a lightly doped P-type semiconductor body or substrate 402 (FIG. 4). It will be appreciated that although the term substrate is intended to include a semiconductor substrate, a semiconductor epitaxial layer deposited or otherwise formed on a substrate and/or any other type semiconductor body, and all such structures are contemplated as falling within the scope of the present invention. Additionally, the masking layer 404 can include any suitable material that can serve as an implantation mask. The first masking layer 404 can, for example, include a photo-resist material and/or a dielectric material (e.g., oxide) formed via a spin-on and/or other type deposition process.

Figure 5:
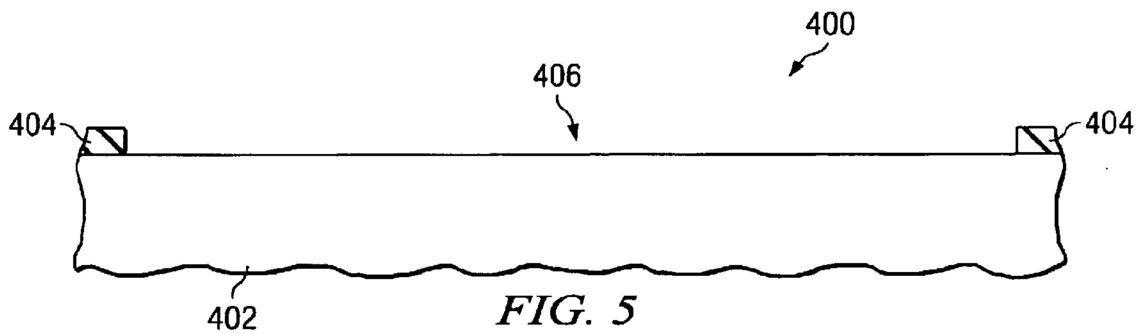

The first masking layer 404 is then patterned to form an opening 406 therein (FIG. 5). A photo-resist can, for example, be formed to a thickness of about 0.96 microns and then selectively exposed to particular type(s) of radiation to form a pattern therein. A solvent can then be utilized to selectively remove the exposed or unexposed portions of the photo-resist depending upon whether the resist is a positive or negative photo-resist to reveal the pattern. Similarly, a dry or wet etch can be utilized to pattern an oxide based first masking layer 404.

Figure 6:
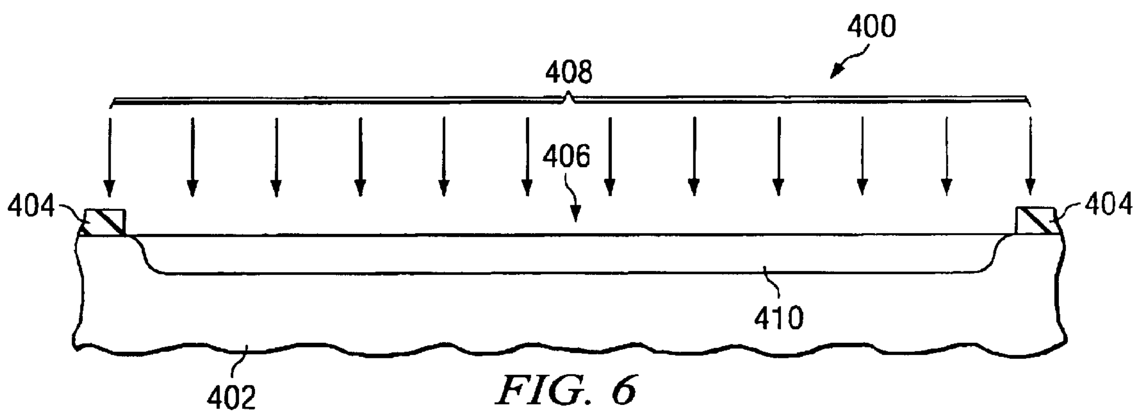

A first dopant 408 is then applied to the structure (FIG. 6). The dopant 408 is blocked by the layer of masking material 404, but passes through the opening 406 formed therein. In this manner, a doped region 410 is formed within the substrate 402 at a location coincident with the opening 406 formed within the layer of masking material 404. The dopant 408 is implanted in the substrate 402 at a concentration (in atoms/$cm^3$) and at an associated energy (in KeV). The degree of doping is thus dependent upon these parameters, as well as the duration of the implantation. The dopant 408 may, for example, be one or more N-type dopants such as Arsenic (As) and/or Antimony (Sb) to establish an N buried layer (NBL) 410 within the transistor substrate 402. A dopant 408 of Antimony can, for example, be implanted at a concentration of about 4.5 $e^{15}/cm^3$ at an energy level of about 60 KeV to establish the NBL 410 within the transistor substrate 402.

Figure 7:
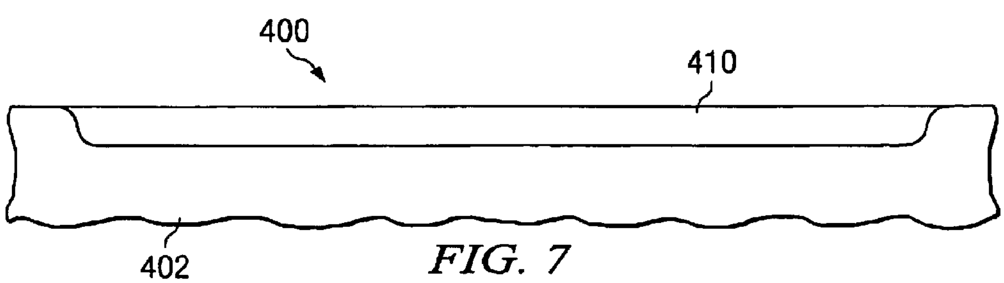
Figure 8:
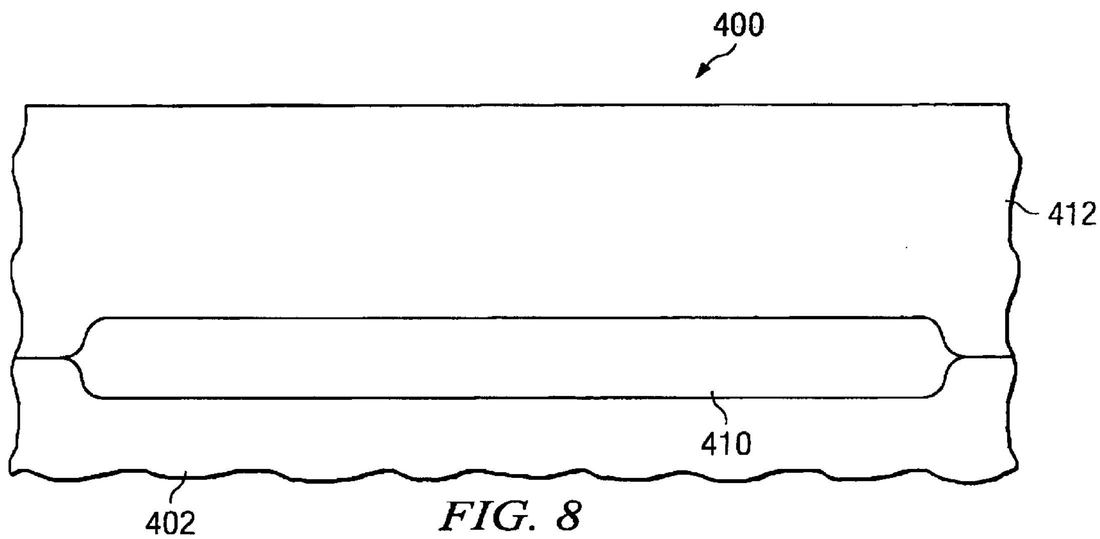

The remaining portions of the first masking material 404 are then removed or stripped away from the substrate 402 (FIG. 7). A semiconductor layer 412 is then formed over the substrate 402 (FIG. 8). For example, a P-type layer formed via epitaxial growth (P-epi) can be established over the substrate. Such a P-epi layer can, for example, be formed to a thickness of between about 5 to 25 microns at about 1150 degrees Celsius. It will be appreciated that the P-epi layer 412 may include a P-type dopant, such as Boron, for example. It will also be appreciated that due to the thermal conditions present during formation of the P-epi layer (as well as other subsequent processing), the NBL region 410 may diffuse up into the P-epi layer (e.g., to about 1750 Angstroms).

Figure 9:
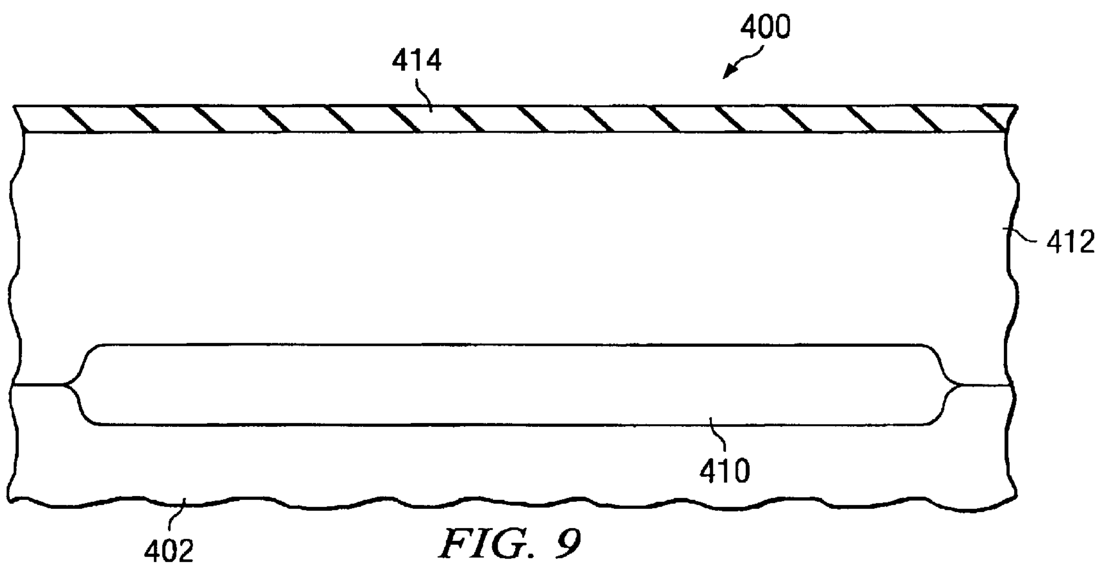

A second layer of masking material 414 is then formed over the P-epi layer 412 (FIG. 9). As with the first masking layer 404, the second layer of masking material 414 can include any suitable material and/or combination of materials that can be patterned to facilitate a subsequent selective doping. For example, the second masking layer 414 can include a photo-resist material and/or a dielectric material formed via a spin-on and/or other type deposition process.

Figure 10:
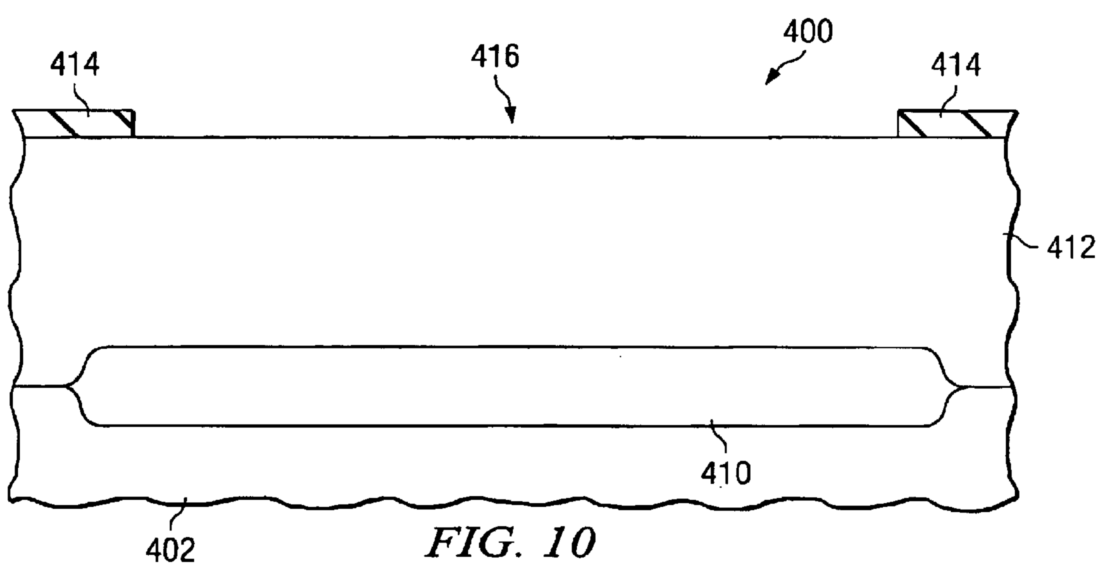
Figure 11:
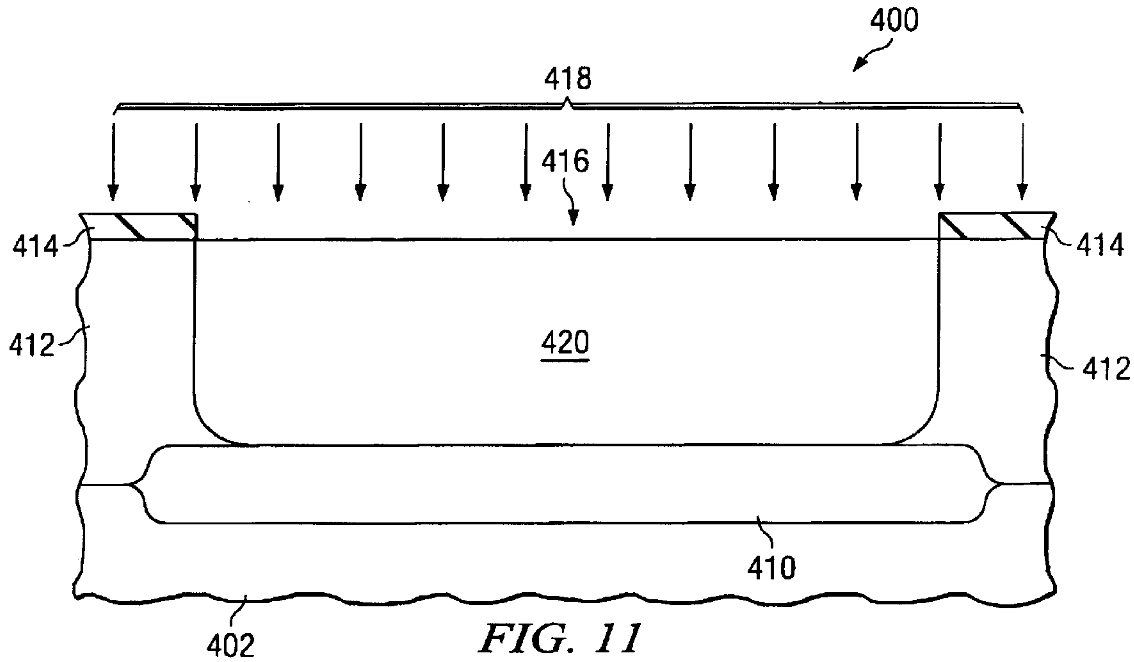
Figure 12:
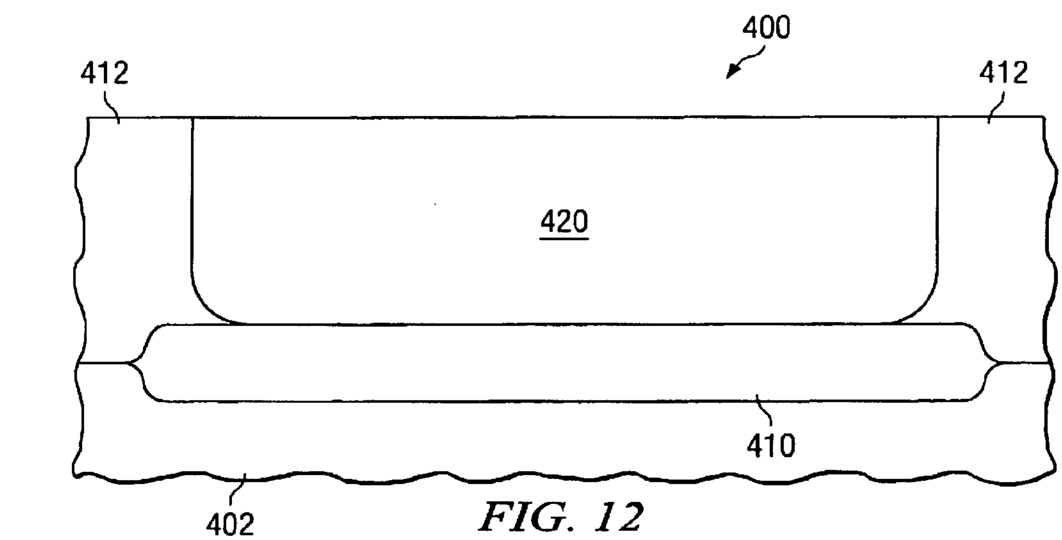

The second masking layer 414 is patterned to form an opening 416 therein (FIG. 10). The second layer of masking material 414 can, for example, be patterned with particular type(s) of radiation as discussed above. In one example, the opening 416 is arranged so as to overlie the NBL region 410 formed within the substrate 503. A second dopant implant 418 is then performed to establish a deep N-well (DNWELL) 420 within the P-epi layer 412 above the NBL region 410 (FIG. 11). The second implant 418 is a lightly doped, high energy implant utilizing one or more N-type dopants such as Arsenic (As) and/or Phosphorous (P). Arsenic can, for example be implanted at a concentration of 4 $e^{11}/cm^3$ at an energy level of 135 KeV. Phosphorous can similarly be implanted at a concentration of 3.6 $e^{12}/cm^3$ and at an energy level of 900 KeV, for example. Additionally, the DNWELL 420 can also be subjected to heat treatment to achieve the desired junction depth and doping concentration. The remaining second masking layer 414 is then removed (FIG. 12).

Figure 13:
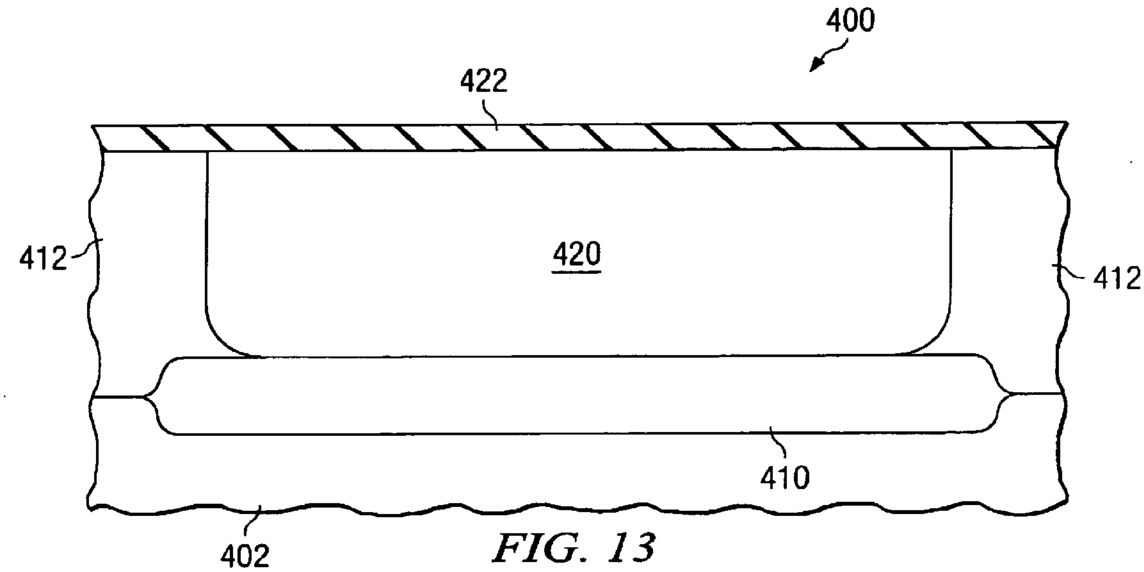
Figure 14:
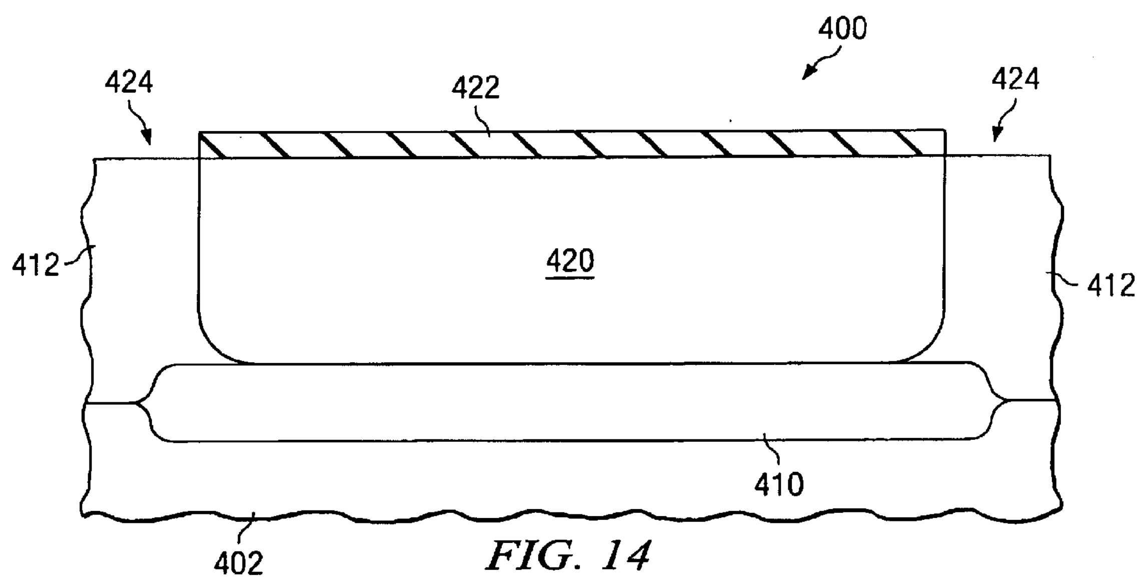

An optional third layer of masking material 422 is then formed over the P-epi layer 412 (FIG. 13). The third optional masking layer 422 can, for example, be formed to a thickness of about 7500 Angstroms at about 1000 degrees Celsius for about 184 minutes in the presence of a steam oxidation. The third masking layer 422 is patterned as described above to form openings 424 over the P-epi layer 412 adjacent the DNWELL 420 (FIG. 14). A dry etch can, for example, be utilized to pattern the third masking layer 422 to about 0.96 micrometers.

Figure 15:
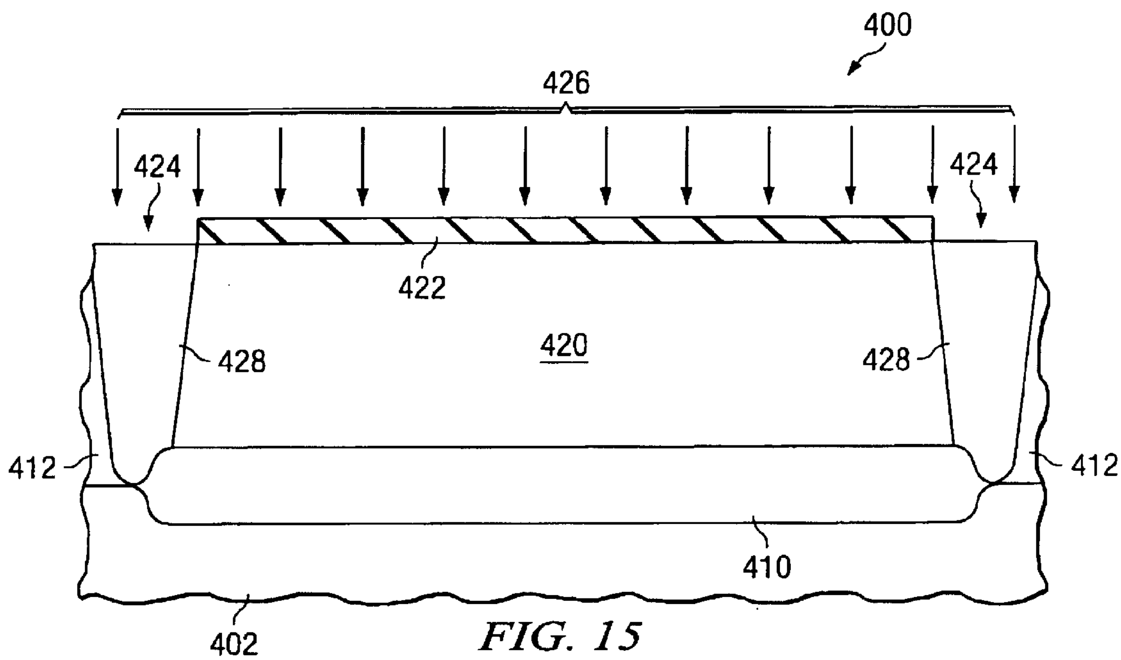
Figure 16:
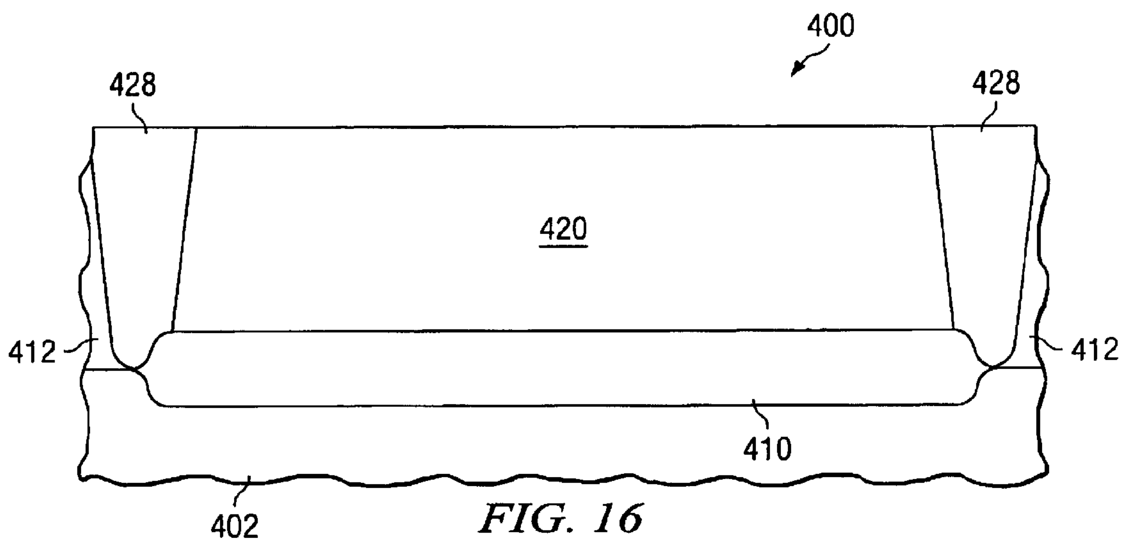

An optional third implant 426 is then performed to form optional deep N+ regions 428 within the P-epi layer 412 adjacent the DNWELL 420 (FIG. 15). The third implant 426 is a highly doped, high energy implant utilizing an N-type dopant such as Arsenic and/or Phosphorous, for example. Upon implant and activation (e.g., via heat treatment), the deep N+ regions 428 extend down to the NBL region 410. It is to be appreciated that the ordering of the acts described herein can be altered and that such re-ordering is contemplated by one or more aspects of the present invention. For example, the deep N+ regions 428 can be formed prior to forming the DNWELL area 420 within the P-epi region 412. It is to be further appreciated that the third implant and the deep N+ regions formed thereby are not required and are not included in a preferred example. Such deep N+ regions may nevertheless serve to mitigate lateral parasitic PNP action, however. The remaining third masking layer 422 is then removed or stripped away (FIG. 16)

A double diffused well (DWELL) 430 comprised of an N-type surface layer and a P-type body layer is then formed within the DNWELL portion 420 of the P-epi region 412 above at least part of the NBL region 410 (in this example). Meanwhile this DWELL layer is used elsewhere to form DMOS transistors in this process.

Figure 17:
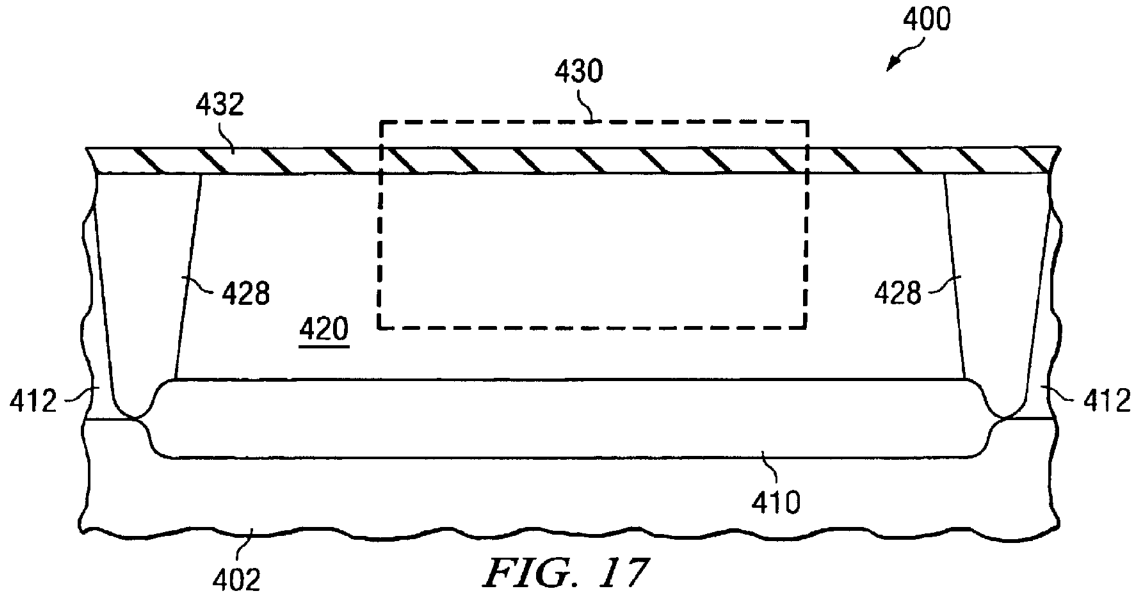
Figure 18:
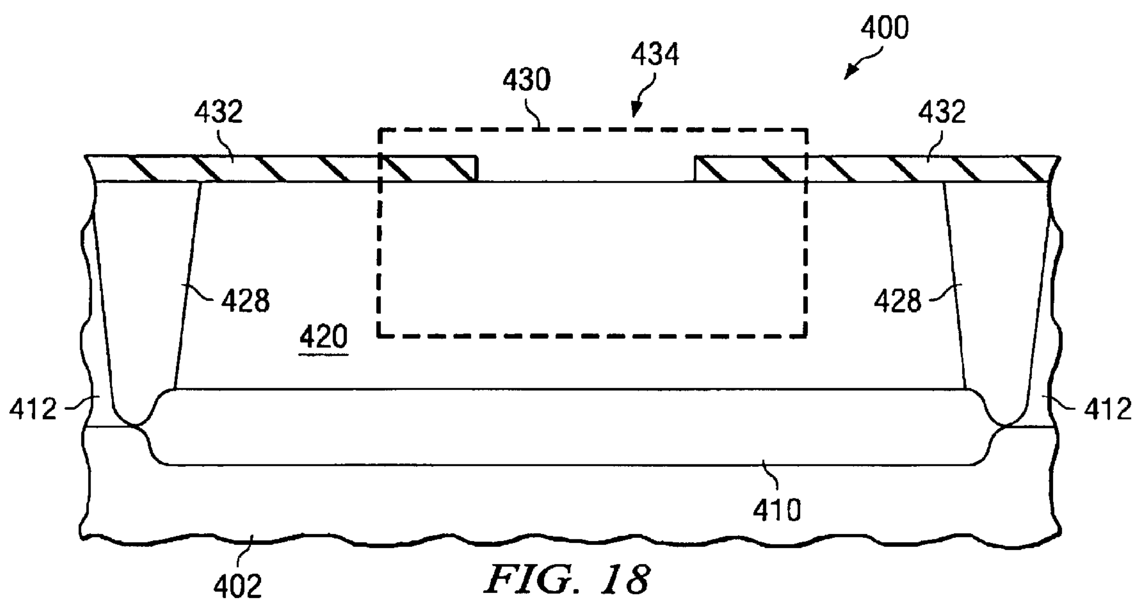

Accordingly, a fourth layer of masking material 432 is formed over the P-epi layer 412 (FIG. 17). This DWELL masking layer 432 is then patterned in a manner as discussed above to form an opening 434 therein above the P-epi 412 and NBL 410 regions (FIG. 18).

Figure 19:
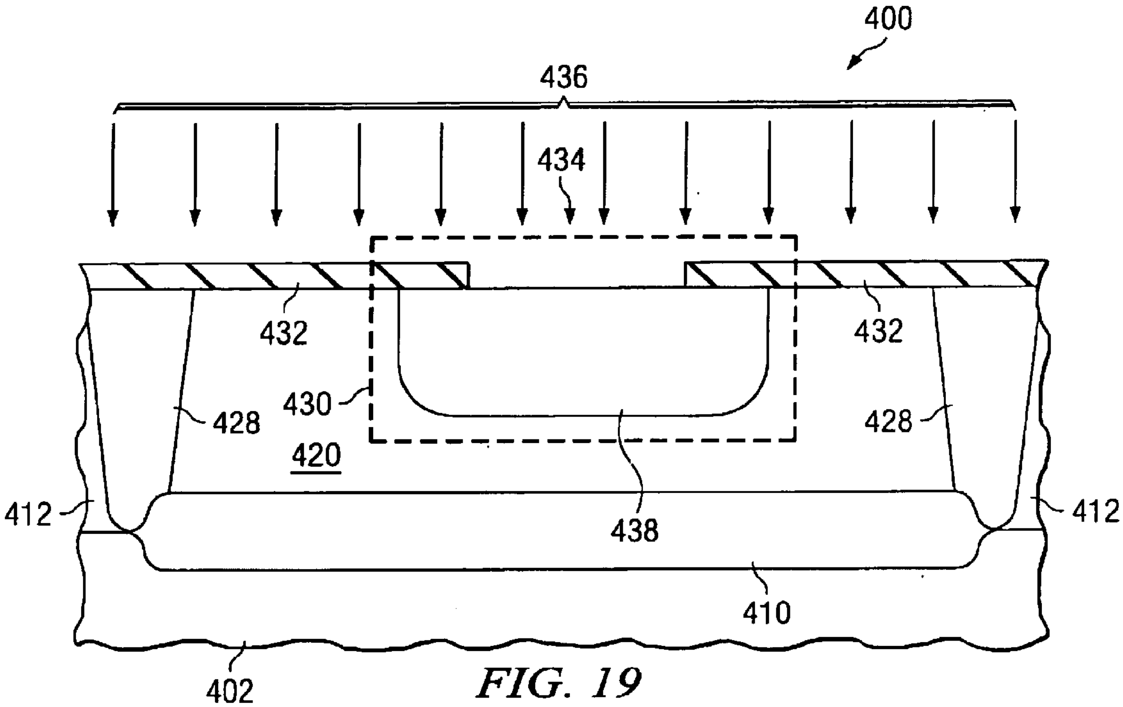

A fourth implantation 436 is then performed to establish a P-type body layer 438 within the DNWELL region 420 (FIG. 19). The fourth implant 436 can be a single or multiple implant process and utilize a P-type dopant such as Boron, for example. In one example, Boron can be implanted at a concentration of 2 $e^{13}/cm^3$ at an energy level of 50 KeV, and then at a concentration of 1.5 $e^{14}/cm^3$ at an energy level of 400 KeV to achieve a desirable DWELL doping profile.

Figure 20:
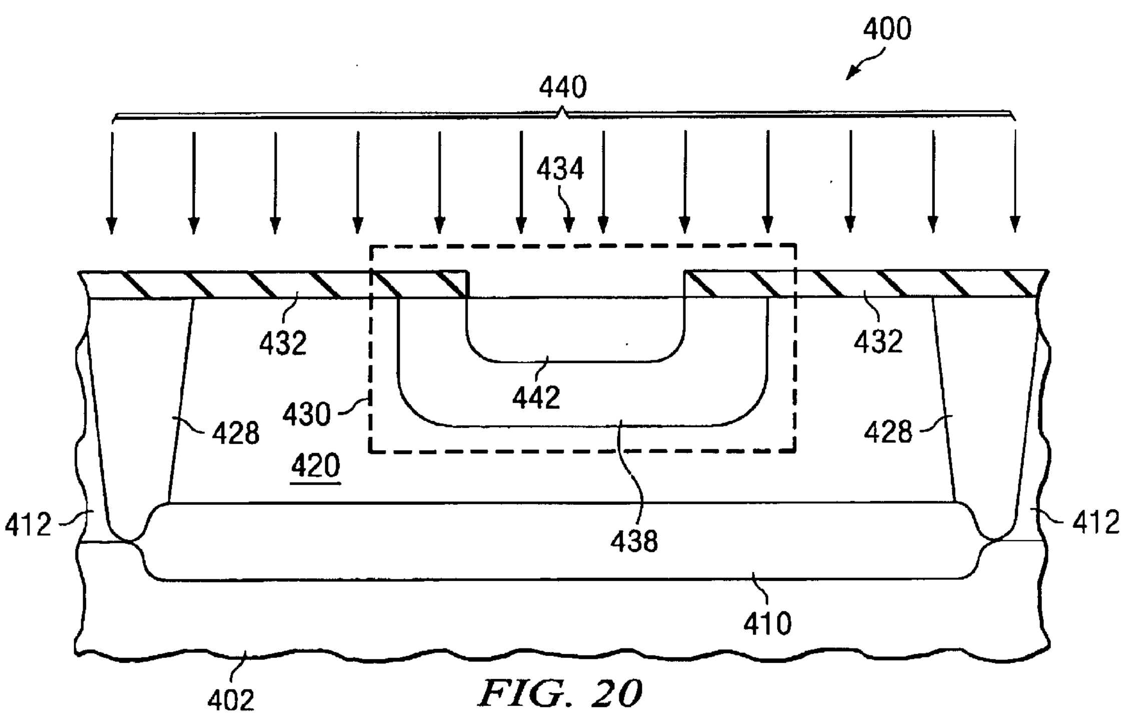
Figure 21:
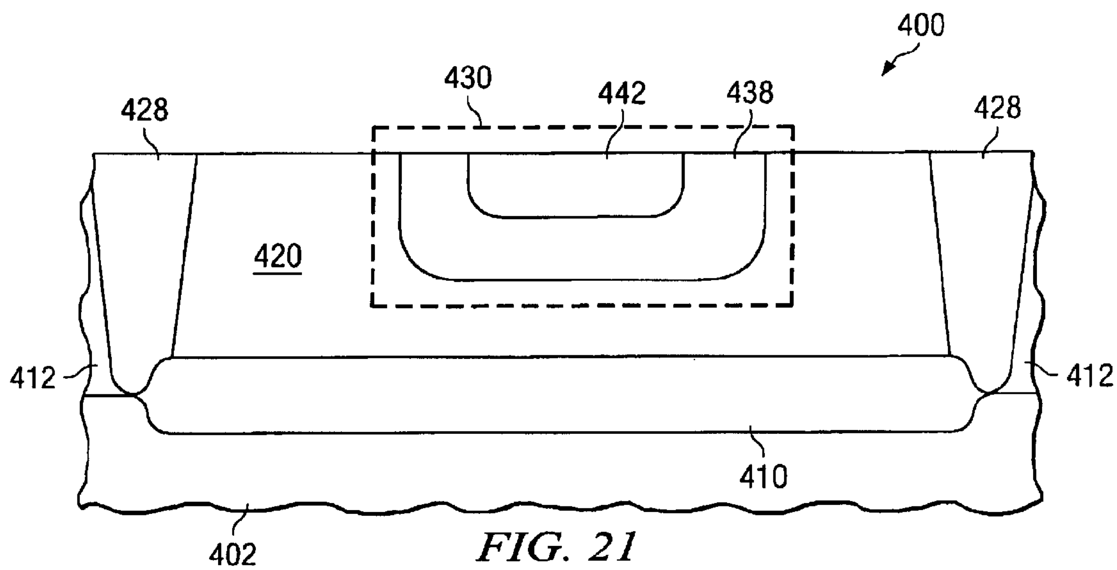

Then a fifth implant 440 is performed using the fourth masking layer 432 to establish an N-type surface layer 442 within the P-type body layer 438 (FIG. 20). The fifth implant 440 can be a low energy implant utilizing an N-type dopant such as Arsenic, for example, to establish the N-type surface layer to depth of about 0.2 microns. In one example, a dopant of Arsenic is implanted at a concentration of 7.5 $e^{13}/cm^3$ at an energy level of 160 KeV. The fifth implant 440 can then be annealed to remove implant damage. The fourth masking layer 432 is then stripped away (FIG. 21).

It will be appreciated that even though the P-type body 438 and the N-type surface layer 442 are implanted through the same opening 434 in the fourth masking layer 432, the P-type body 438 has a slightly greater width than the N-type surface layer 442. This is due to additional diffusion of the P-type dopant in the body layer (e.g., from heat treatment such as annealing). It will be further appreciated that respective masking layers can be formed, patterned and stripped away to form the P-type body 438 and N-type surface layer 442 of the DWELL 430.

Figure 22:
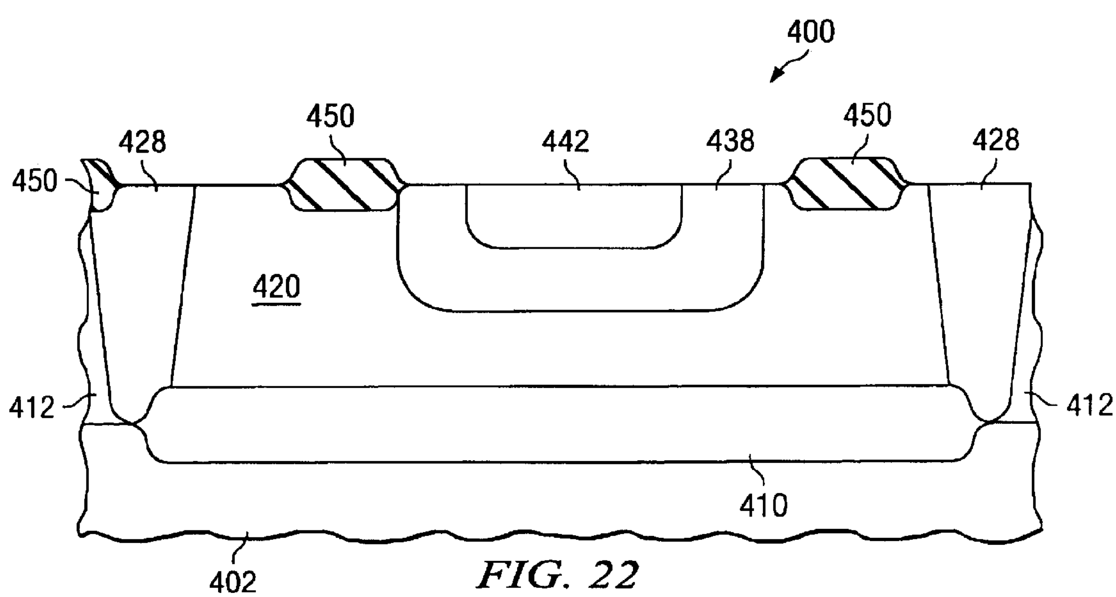
Figure 23:
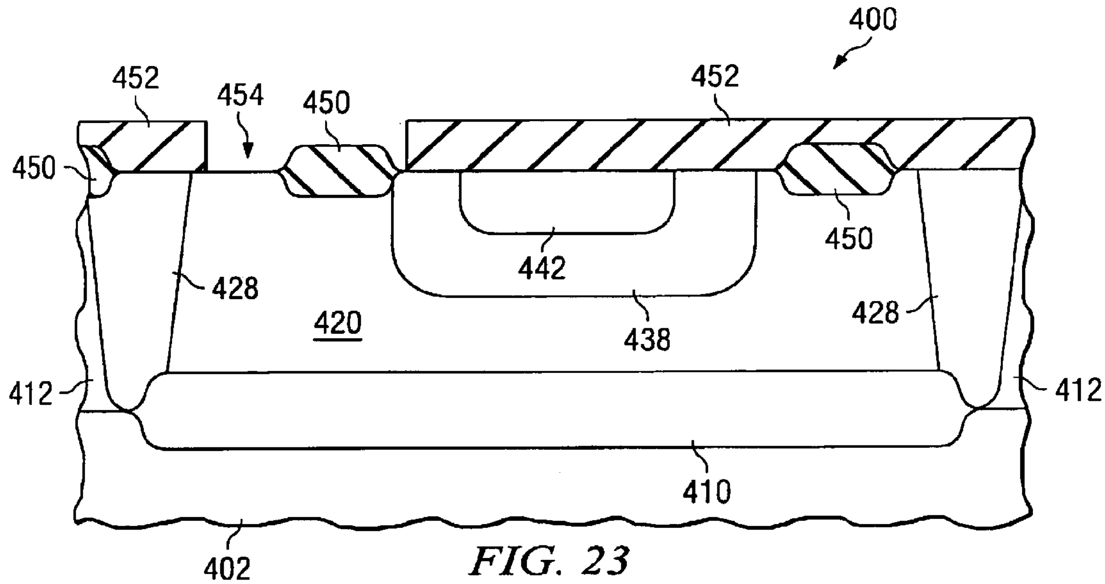

Field oxidation then occurs at the surface of the transistor (FIG. 22). In particular, surface portions 450 of the transistor 400 are selectively exposed via another mask (not shown) etched and allowed to oxidize (e.g., via conventional LOCOS process). By way of example, oxidation occurs at about 950 degrees Celsius in the presence of steam in the span of about 230 minutes. The select oxidized areas 450 can, for example, have a thickness between about 5800 to 6600 Angstroms. Alternatively, isolation may be provided via a shallow trench isolation (STI) process.

Figure 24:
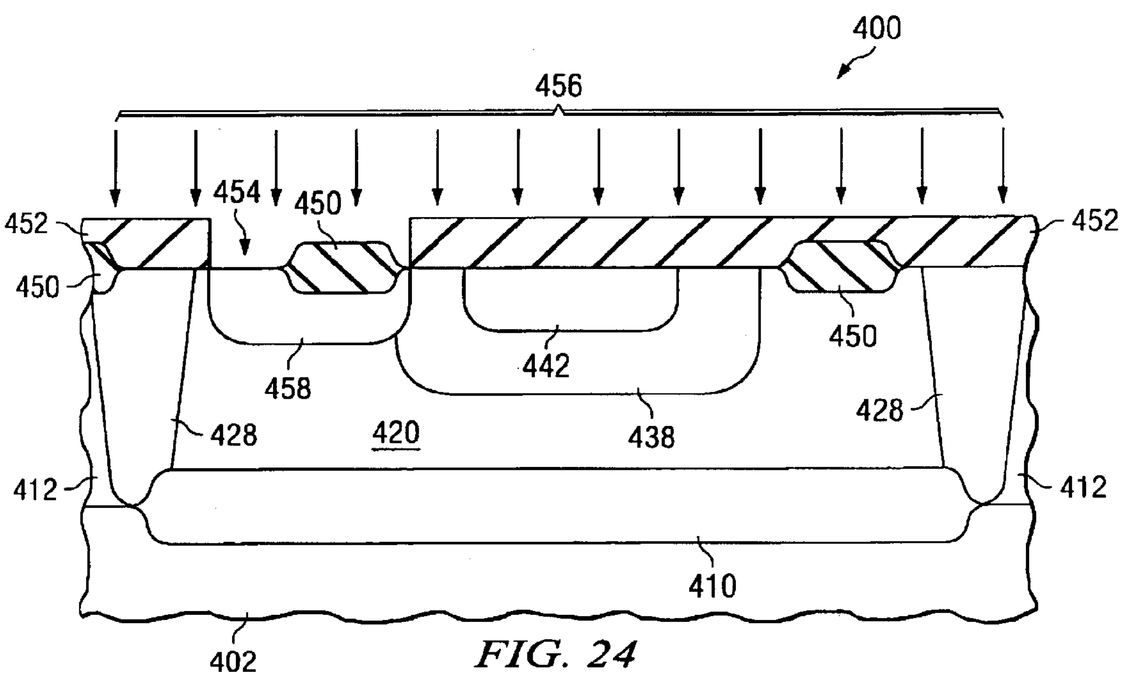
Figure 25:
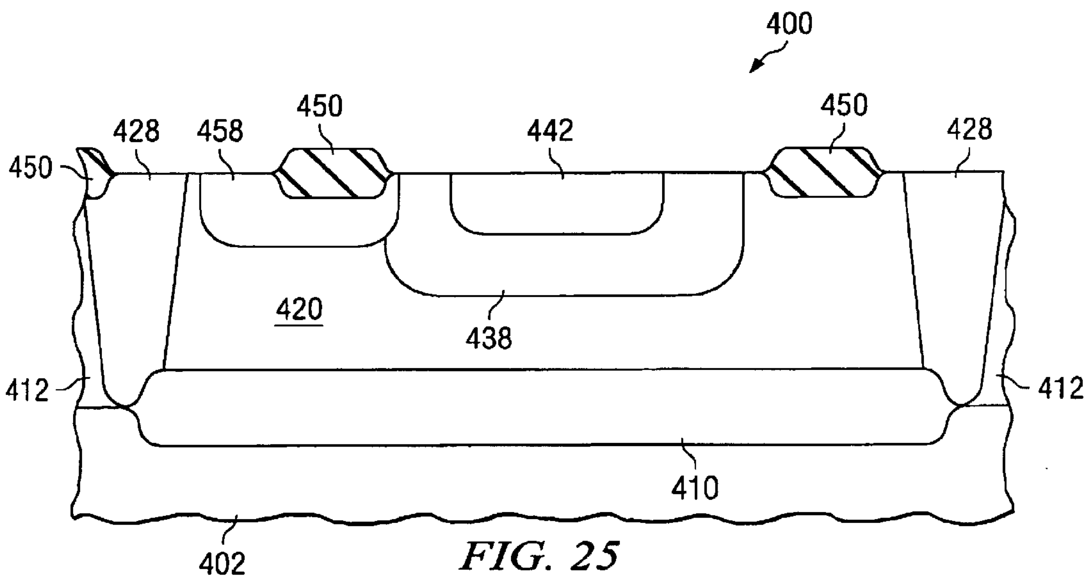

A shallow p-well (SPWELL) region is then formed in the DNWELL region 420 adjacent to, and potentially slightly overlapping, the P-type body portion 438 of the DWELL region 430. Accordingly, a fifth masking layer 452 is formed and patterned as described above to form an opening 454 therein (FIG. 23). Such a masking layer may be formed to about 2.5 microns, for example. A sixth implant 456 is then performed to form the SPWELL 458 (FIG. 24). A P-type dopant, such as Boron can, for example, be implanted at a concentration of about 1.6 $e^{13}/cm^3$ at an energy level of about 500 KeV. It will be appreciated that the SPWELL implantation can be followed by thermal processing. Such processing can facilitate diffusion of the dopant under oxidized areas 450. The dopant may also, however, become located under the oxidized areas 450 as a result of passing through the areas 450 during implantation. The fifth masking layer 452 is then removed (FIG. 25).

Figure 26:
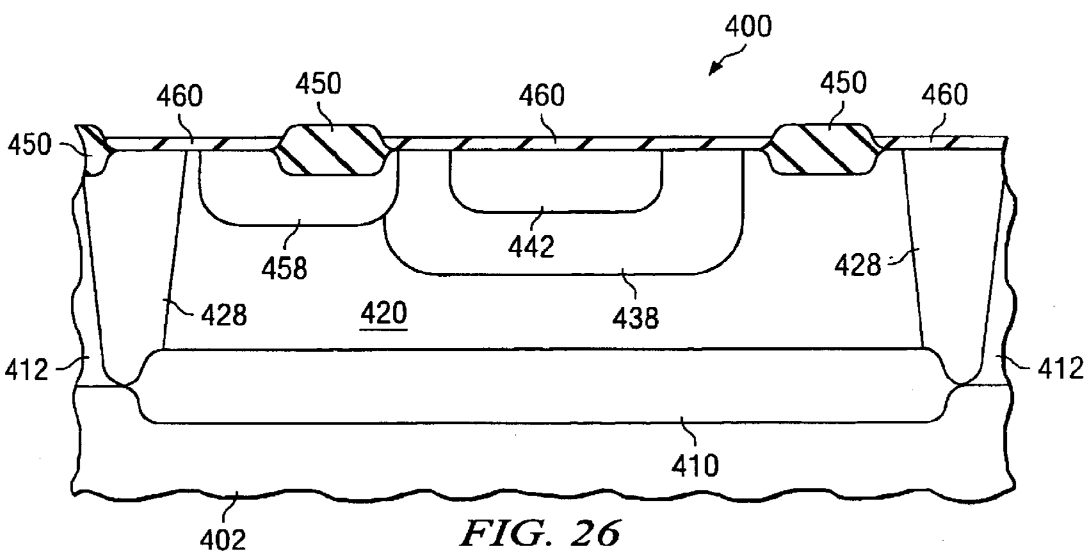
Figure 27:
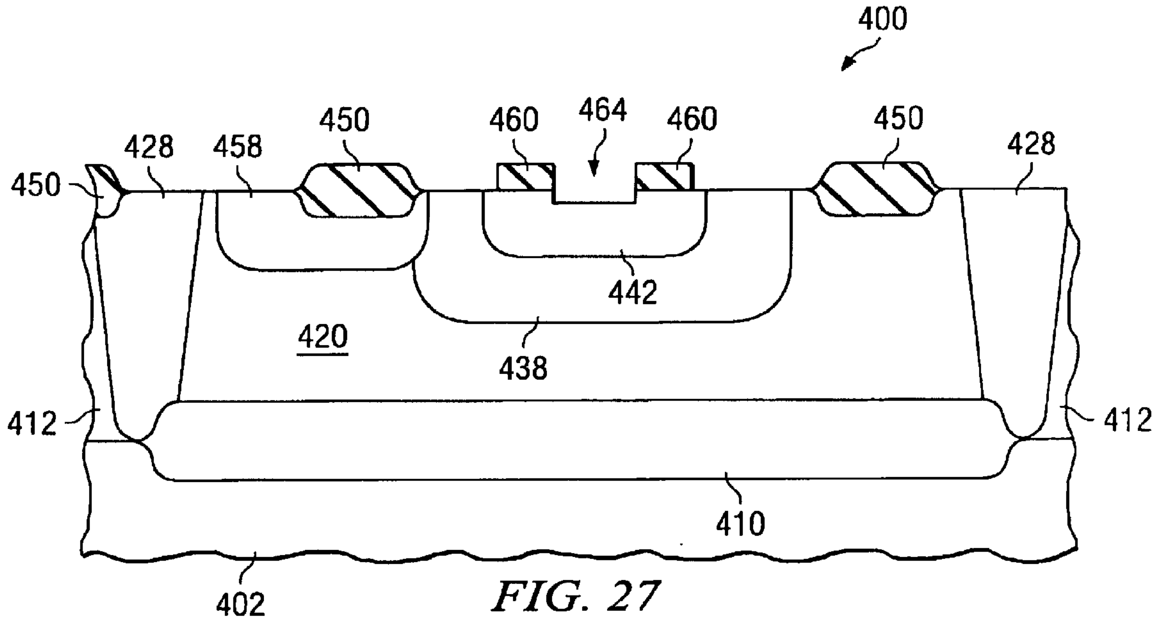

A layer of oxide material 460 is then formed over the entire structure (FIG. 26). The oxide layer 460 can, for example, be formed to a thickness of about 300 to 400 Angstroms at about 900 degrees Celsius in the presence of $O_2$. The layer of oxide material 460 serves as a gate oxide in a high voltage CMOS/DMOS device and is patterned accordingly (FIG. 27). Alternatively, a gate oxide associated with a low voltage CMOS/DMOS device (e.g., having a thickness of about 75 Angstroms or less) may be employed. The patterning of the oxide layer exposes a portion 464 of the N-type surface layer 442 of the DWELL 430, the silicon elsewhere is covered by the gate oxide.

Figure 28:
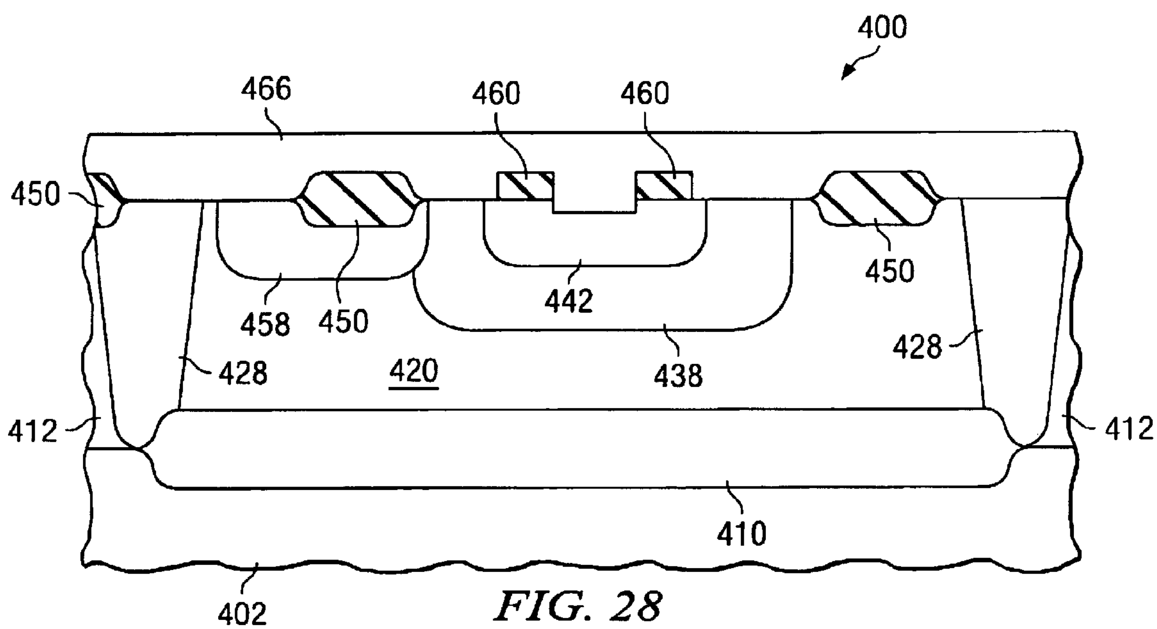
Figure 29:
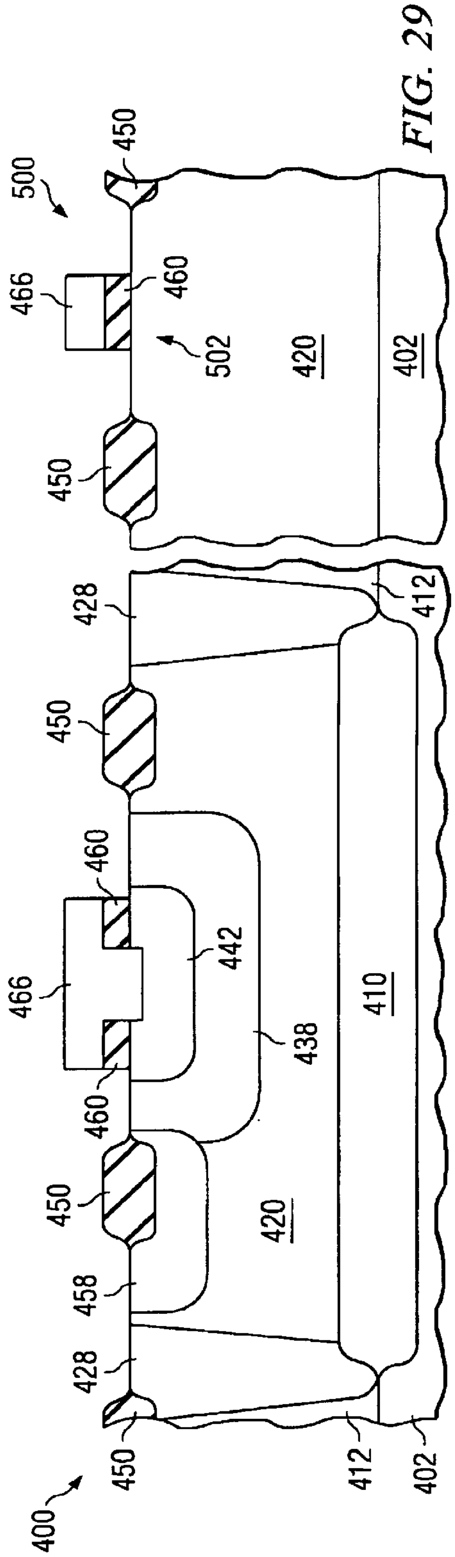

A layer of poly-silicon 466 is then deposited over the entire structure (FIG. 28). The poly-silicon layer 466 can, for example, for formed to about 2400 to 5000 Angstroms. It will be appreciated that some of the poly-silicon 466 fills in the void 464 created over the N-type surface layer 442 of the DWELL 430 during patterning of the oxide layer 460. The layer of poly-silicon 466 is then patterned so as to serve as part of a gate electrode stack 502 of a CMOS/DMOS device 500 (FIG. 29). It will be appreciated that the poly-silicon 466 may include a dopant, such as a P-type dopant (e.g., Boron) or may be subsequently doped.

Figure 30:
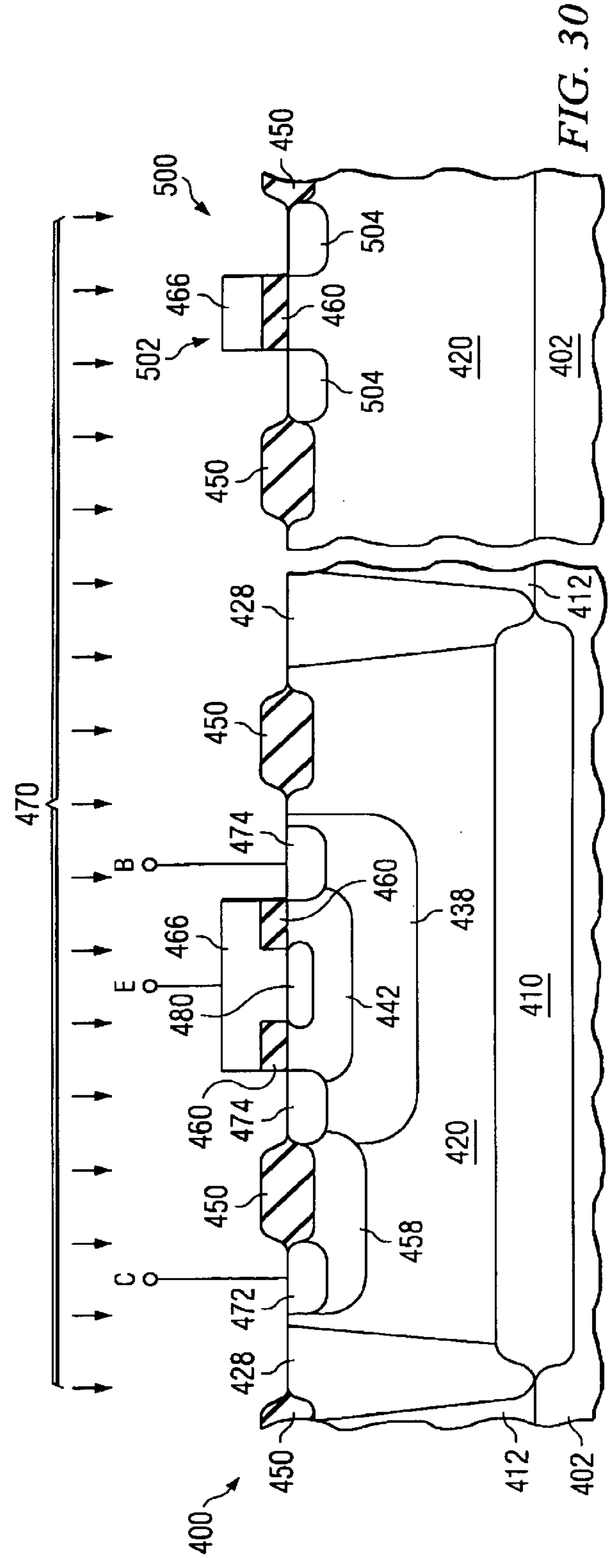

One or more subsequent implants 470 (such as those employed in the BiCMOS process to form P-type and N-type source/drain regions) are then performed to form a collector region contact and a base region contact, respectively (FIG. 30). Accordingly, a PMOS source/drain mask (no shown) may be utilized to define an opening through which a P-type source/drain implant 470 is performed to form a PSD (P-type source/drain) region 472 that serves as a contact for the collector region of the poly-emitter vertical bipolar transistor. Such implant may also be used to dope the poly-silicon emitter con act 466. Similarly, an NMOS source/drain mask (not shown) may be employed to define one or more openings through which an N-type source/drain implant 470 is performed to form an NSD (N-type source/drain) region(s) 474 that serves as a contact for the base of the bipolar transistor 400. That is, the same implant 470 employed to form the PMOS and NMOS transistor source/drain regions 504 elsewhere on the semiconductor wafer die is employed to form the collector contact and base contact for the bipolar transistor 400.

It will be appreciated that the emitter 480 of the vertical PNP transistor 400 is created by allowing P-type dopant (e.g., Boron) in the P-type poly 466 to diffuse into the N-type surface layer 442 of the DWELL 430, such as may result from an annealing and/or other heat treatment process. The N-type surface layer 442 serves as the vertical PNP's base, which is very shallow (e.g., about 0.2 microns). The shallow base improves the device's frequency (Ft) and gain (Hfe). The emitter 480 can, for example, be the same size as other contacts 472, 474, which can be several times smaller than a conventional moat emitter. Moreover, the vertical PNP transistor can have an overall height less than that of conventional transistors, such as about 0.7 to 1.0 microns as compared to about 2 to 5 microns. The DWELL P-type body 438 and SPWELL 458 are used as the collector region in the present example. To isolate the DWELL collector from the p-type substrate 402, the DNWELL 420 is used to surround the DWELL region 430.

Accordingly, the double diffused DWELL has an N-type surface layer 442 and a P-type body layer 438 that act as a base and a collector of a vertical PNP, respectively. The vertical PNP thus has a thin base and therefore is faster and has better gain than conventional bipolar devices. Additionally, such performance advantage is obtained by merely adding a mask to form the exposed silicon region 464 in gate oxide as depicted in FIG. 27. The PNP is also smaller than conventional devices and its emitter size can be as small as one contact (e.g., is reduced from 5 by 5 square microns to about 0.8 by 0.8 square microns). Also, the N buried layer (NBL) 410 mitigates punch-through from the collector (DWELL) 430 to the substrate 402, and the shallow P well (SPWELL) 458 serves as a guard ring of the DWELL collector contact. The vertical PNP 400 is thus formed as part of a CMOS/DMOS fabrication process without requiring a significant number of additional steps and/or masks in the process. No changes are required in baseline processes, existing components and/or design rules, and there is minimal extra cost for the one additional mask.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of forming a vertical PNP bipolar transistor in a BiCMOS process, where the transistor is formed upon a wafer having a silicon substrate, the method comprising:

forming a double diffused DWELL in a DNWELL formed within a P-epi layer formed across the substrate;

forming a SPWELL in the DNWELL region adjacent the DWELL region;

forming a layer of oxide material over the wafer, at least portions of the oxide layer forming gate oxide regions for MOS transistor devices on the wafer;

patterning the layer of oxide material to form an opening overlying and exposing silicon in a portion of the double diffused DWELL;

forming a layer of poly-silicon across the wafer;

patterning the layer of poly-silicon forming gate electrodes over the gate oxide regions for the MOS transistor devices and forming an emitter contact that fills the opening overlying the double diffused DWELL for the vertical PNP transistor; and performing PSD/NSD implants to establish a collector contact and a base contact, respectively, for the vertical PNP transistor.

2. The method of claim 1, wherein the PSD implant occurs within the SPWELL.

3. The method of claim 1, wherein the NSD implant occurs within the DWELL.

4. The method of claim 1, further comprising:

forming deep N+ regions within the P-epi layer adjacent the DNWELL.

5. The method of claim 1, wherein the DNWELL is implanted with a dopant of Boron at a concentration of about 1.6 $e^{13}/cm^3$ at an energy level of about 500 KeV in forming the SPWELL.

6. The method of claim 1, further comprising:

forming an N buried layer (NBL) within the substrate so as to underlie the DNWELL and P-epi layer.

7. The method of claim 6, wherein the NBL comprises at least one of Arsenic and/or Antimony.

8. The method of claim 6, wherein forming the NBL comprises:

implanting a dopant of Antimony at a concentration of about 4.5 $e^{15}/cm^3$ at an energy level of about 60 KeV.

9. The method of claim 1, wherein forming the DWELL comprises:

implanting a P-type dopant into the DNWELL through an opening in a mask to form a P-type body layer; and implanting an N-type dopant into the P-type body layer through the same opening in the same mask to establish an N-type surface layer.

10. The method of claim 9, wherein the P-type body layer serves as a collector of the transistor.

11. The method of claim 9, wherein the DWELL is implanted with Boron at a concentration of 2 $e^{13}/cm^3$ at an energy level of 50 KeV, and then at a concentration of 1.5 $e^{14}/cm^3$ at an energy level of 400 KeV in forming the P-type body layer.

12. The method of claim 9, wherein the P-type body layer is implanted with Arsenic at a concentration of 7.5 $e^{13}/cm^3$ at an energy level of 160 KeV in forming the N-type surface layer.

13. The method of claim 9, wherein the N-type surface layer serves as a base of the transistor.

14. The method of claim 13, wherein the base has a thickness of about 0.2 microns.

15. The method of claim 9, wherein the patterned poly-silicon comprises a P-type dopant that diffuses through the gate oxide opening into a small portion of the N-type surface layer of the DWELL, thereby establishing an emitter for the vertical PNP transistor.

16. The method of claim 15, wherein the emitter is about 0.8 by 0.8 microns in size.

17. The method of claim 15, wherein the patterned poly-silicon comprises Boron that diffuses into the N-type surface layer to establish an emitter for transistor.

18. A method of forming a transistor, comprising:

forming a well of a first conductivity type in a semiconductor body of a second conductivity type;

forming a mask over the semiconductor body with an opening overlying the well;

forming a collector region of the second conductivity type in the well using the mask;

forming a base region of the first conductivity type in the collector region using the mask;

forming an insulating layer over the semiconductor body;

forming an opening in the insulating layer over the base region;

forming a polysilicon layer doped with the second conductivity type over the insulating layer, the polysilicon layer filling the opening and contacting a portion of the base region associated with the opening; and diffusing dopant of the second conductivity type into a top portion of the base region, wherein the top portion comprises an emitter region of the second conductivity type.

19. The method of claim 18, wherein the first conductivity type comprises n-type and the second conductivity type comprises p-type.

20. The method of claim 18, wherein the collector contact region and base contact region are formed using source/drain implants employed for MOS transistors elsewhere in the semiconductor body.

21. The method of claim 18, wherein forming the insulating layer comprises forming an oxide layer employed as a gate oxide layer for MOS type devices elsewhere in the semiconductor body.

22. The method of claim 21, wherein the polysilicon layer is employed as a gate electrode for the MOS type devices.

23. The method of claim 18, further comprising forming a supplemental collector region within the well, the supplemental collector region laterally connecting to the collector region.

24. The method of claim 23, further comprising forming a collector contact region in the supplemental collector region, and a base contact region in the base region.

25. The method of claim 18, wherein the semiconductor body comprises an epitaxial layer formed over a semiconductor substrate.

26. The method of claim 25, wherein the well comprises a deep n-type well formed within the epitaxial layer.

27. The method of claim 26, wherein forming the collector region comprises:

performing a first implantation into the well through the mask opening with a p-type dopant having a first concentration and a first energy; and performing a second implantation into the well with the p-type dopant having a second concentration and a second energy, wherein the first concentration is less than the second concentration and the first energy is less than the second energy.

28. The method of claim 27, wherein the p-type dopant comprises Boron, the first concentration is about 2 $e^{13}/cm^3$, and first energy is about 50 keV, the second concentration is about 1.5 $e^{14}/cm^3$, and the second energy is about 400 keV.

29. The method of claim 27, wherein forming the base region comprises performing an n-type implant into the collector region through the mask opening, wherein a depth of the base region is less than a depth of the collector region.

30. The method of claim 29, wherein the n-type dopant comprises Arsenic, the concentration is about 7.5 $e^{13}/cm^3$, and the energy is about 160 keV.

* * * * *